(12) United States Patent
Liu et al.

(10) Patent No.: US 6,768,084 B2
(45) Date of Patent: Jul. 27, 2004

(54) ADVANCED RAPID THERMAL PROCESSING (RTP) USING A LINEARLY-MOVING HEATING ASSEMBLY WITH AN AXISYMMETRIC AND RADIALLY-TUNABLE THERMAL RADIATION PROFILE

(75) Inventors: Yong Liu, Lynnfield, MA (US); Jeff P. Hebb, Boston, MA (US)

(73) Assignee: Axcelis Technologies, Inc., Beverly, MA (US)

(*) Notice: Subject to any disclaimer, the term of this patent is extended or adjusted under 35 U.S.C. 154(b) by 16 days.

(21) Appl. No.: 10/261,907

(22) Filed: Sep. 30, 2002

(65) Prior Publication Data

US 2004/0060917 A1 Apr. 1, 2004

(51) Int. Cl.⁷ .................................................. F27B 5/14
(52) U.S. Cl. ........................ 219/390; 219/405; 219/411; 392/416; 118/724; 118/725; 432/229; 432/230
(58) Field of Search ................................ 219/390, 405, 219/411; 118/724, 725, 50.1; 392/416, 418; 432/229–231

(56) References Cited

U.S. PATENT DOCUMENTS

| | | | |
|---|---|---|---|
| ,009,255 A | 9/1852 | Savas | |
| 4,857,689 A | 8/1989 | Lee | |
| 5,900,177 A | 5/1999 | Lecouras et al. | |
| 6,002,109 A | 12/1999 | Johnsgard et al. | |
| 6,043,460 A | 3/2000 | Johnsgard et al. | |
| 6,046,439 A | 4/2000 | Johnsgard et al. | |
| 6,123,766 A | 9/2000 | Williams et al. | |
| 6,133,550 A | 10/2000 | Griffiths et al. | |
| 6,167,195 A | 12/2000 | Moslehi et al. | |
| 6,169,271 B1 | 1/2001 | Savas et al. | |
| 6,172,337 B1 | 1/2001 | Johnsgard et al. | |
| 6,179,466 B1 | 1/2001 | Peuse et al. | |
| 6,183,127 B1 | 2/2001 | Hebb et al. | |
| 6,188,044 B1 | 2/2001 | Lee et al. | |
| 6,198,074 B1 | 3/2001 | Savas | |
| 6,215,106 B1 | 4/2001 | Boas et al. | |
| 6,301,434 B1 | 10/2001 | McDiarmid et al. | |
| 6,303,906 B1 | 10/2001 | Yoo | |
| 6,315,512 B1 | 11/2001 | Tabrizi et al. | |
| 6,331,697 B2 | 12/2001 | Savas | |
| 6,342,691 B1 | 1/2002 | Johnsgard et al. | |
| 6,345,150 B1 | 2/2002 | Yoo | |
| 6,355,909 B1 | 3/2002 | Griffiths et al. | |
| ,047,004 A1 | 4/2002 | Johnsgard et al. | |

*Primary Examiner*—Shawntina Fuqua
(74) *Attorney, Agent, or Firm*—Eschweiler & Associates, LLC

(57) ABSTRACT

A system and a method for thermally processing a semiconductor substrate are disclosed which provide a heater chamber and a process chamber environmentally isolated from one another by a thermally-transparent plate. A heater assembly situated within the heater chamber comprises one or more quasi-continuous heater elements, and is operable to linearly translate with respect to the process chamber by a linear translation assembly. Thermal radiation is transmitted from the heater elements through the plate toward a substrate situated within the process chamber, wherein one or more temperature sensors measure a temperature associated with one or more respective locations on the substrate. A controller coupled to the one or more temperature sensors, heater assembly, and linear translation assembly controls the thermal radiation emitted by the heater assembly, as well as a distance between the heater assembly and the substrate, wherein the control is based on the one or more measured temperatures.

51 Claims, 9 Drawing Sheets

ADVANCED RAPID THERMAL PROCESSING (RTP) USING A LINEARLY-MOVING HEATING ASSEMBLY WITH AN AXISYMMETRIC AND RADIALLY-TUNABLE THERMAL RADIATION PROFILE

FIELD OF THE INVENTION

The present invention relates generally to semiconductor thermal processing systems, and more specifically to a system and method for rapid thermal processing using a linearly-moving heating assembly with a radially-tunable thermal radiation profile.

BACKGROUND OF THE INVENTION

High temperature processing of semiconductor (e.g., silicon) wafers is important for manufacturing modern microelectronics devices. Such processes, including silicide formation, implant anneal, oxidation, nitridation, diffusion drive-in, chemical vapor deposition (CVD) and atomic layer deposition (ALD), may be performed at high temperatures and in proper ambient gases or vacuum using conventional thermal processing techniques. Furthermore, many modern microelectronics circuits require feature sizes smaller than one micron and junction depths less than a few hundred angstroms. In order to limit both the lateral and downward diffusion of dopants, as well as to provide a greater degree of control during processing, it is desirable to minimize the duration of high temperature processing as well as vary the gaseous composition around the semiconductor wafers.

One approach for minimizing processing time utilizes a single-wafer rapid thermal processor (RTP). Single-wafer rapid thermal processing of semiconductor wafers provides a powerful and versatile technique for fabrication of ultra-large-scale-integrated (ULSI) electronic devices. Conventional systems and methods of wafer thermal processing may suffer from various shortcomings, however, as will be described hereafter.

One conventional RTP system combines low thermal mass photon-assisted rapid thermal heating with an inert or reactive gaseous ambient for semiconductor wafer processing. Such a single-wafer RTP system utilizes high intensity lamps, optical temperature sensors and sophisticated control algorithms to heat a semiconductor wafer at a high temperature ramp rate, thereby reducing problems associated with high thermal budget to device fabrication. In lamp-based processing, the wafer is generally heated to temperatures of between 450° C. to 1400° C. and may furthermore be rapidly cooled after processing. Problems may be encountered, however, with the use of high intensity lamps as a heat source, particularly for larger diameter wafers. Specifically, it may be difficult to maintain a uniform temperature across a wafer due to individual lamp spacing, as well as other factors.

Typically, not only do temperature differences arise during heating and cooling transients in lamp-based RTP systems, but non-uniformities may also persist during processing. As illustrated in prior art FIG. 1A, a conventional lamp-based RTP lamp assembly 10 is shown, wherein the lamp assembly comprises a plurality of individual incandescent lamps 20. The plurality of lamps 20 are distributed across a surface 15 of the lamp assembly 10, leaving physical spaces 30 between each individual lamp. FIG. 1B illustrates a partial cross-section of the lamp assembly 10, illustrating several individual lamps 20. Each lamp 20 comprises a filament 40, such as tungsten, whereby electrical current passing through the filament resistively heats the filament, thus emitting thermal radiation 50 outward from the lamp. However, a filament 40 only takes a very small portion of physical space in a lamp 20. The spaces 30 between lamps 20 as well as the largely empty spaces inside lamps 20, however, contribute to the non-uniformity of the received thermal radiation over the substrate 60. To obtain uniform heating, lamp based systems typically utilize some combination of optical guides, lenses, and/or reflectors (not shown), as well as wafer rotation, to more evenly distribute thermal radiation onto the substrate 60. Despite these measures, it may be necessary in some systems to actively switch individual lamps or groups of lamps on and off rapidly to control the wafer temperature and minimize the effects of the non-uniform thermal radiation from the lamps. Furthermore, additional problems may be encountered in lamp-based systems due to aging and degradation of lamps and other components. As a result, it may be difficult to maintain repeatable performance, and a frequent replacement of parts and system cleaning may be necessary. Similar problems also exist in linear-lamp based rapid thermal processing systems.

Furthermore, since effective cooling of lamps is essential to increase the life time of lamps, the interior walls of a typical lamp-based RTP system are usually much colder than the wafer under processing and are not uniform in temperature. Therefore, heat transfer between the wafer and the interior walls via conduction and convection has detrimental effects to the uniform heating of the wafer under processing. Furthermore, ambient gases and gas-surface reaction products may deposit and condense onto the cold chamber walls of lamp-based RTP systems, blocking thermal radiation from lamps to the wafer and interfering with pyrometric temperature measurement.

A more advanced hot-wall rapid thermal processing (RTP) furnace (e.g., U.S. Pat. No. 4,857,689 and No. 6,183, 127) can yield superior results over the lamp-based RTP systems in terms of temperature uniformity, process reproducibility and cost while still possessing comparable performance in terms of thermal budget and process throughput. In such hot-wall RTP systems, a stable monotonic temperature and thermal radiation gradient is maintained along the axis of the RTP furnace by constantly heating the upper section of the process chamber and actively cooling the lower section of the process chamber. This steady-state temperature profile is also axially symmetric, with a radial component optimized to ensure the uniform heating of a wafer.

The temperature of a wafer under processing is controlled by varying the position of the wafer along the temperature gradient. Since a thermal steady-state is maintained throughout the entire furnace, and between the furnace and the gas ambient, wafer heating is dominated by the thermal equilibration between the wafer and its furnace environment. Ambient gases flow through the hot wall chamber to interact with the wafer under processing. A hot-wall RTP furnace has a much larger total thermal radiation area than the total filament area of a lamp-based RTP system. A shortcoming associated with the hot-wall RTP systems is the relatively large internal volume of the process chamber, particularly when fast ambient gas switching is required during rapid thermal processing. However, fast ambient gas switching has been successfully realized by placing a wafer inside a small volume quartz reactor that linearly moves along the temperature gradient inside the process chamber.

Yet another rapid thermal processing system utilizes a heated block, or receptor, for thermally processing a wafer within a single chamber. The receptor resides in the chamber, and is heated by one or more resistive heaters. The wafer is inserted into the chamber and is placed on pins protruding through the receptor, and is subsequently lowered via the pins onto the receptor, such that heat transfer occurs from the receptor to the wafer via conduction, convection and radiation. The use of a receptor within a single chamber, however, may introduce various problems. For instance, in rapid thermal chemical vapor deposition (RTCVD) and low-pressure chemical vapor deposition (LPCVD) applications, the receptor can be coated by the material being deposited on the wafer (e.g., doped or undoped polysilicon, silicon dioxide, silicon nitride, etc.). The unwanted depositions on the receptor can result in particulate generation, cross contamination, process uniformity drifts, as well as problems associated with temperature measurement and process control.

Therefore, for at least the above mentioned reasons, an improved rapid thermal processing system and method is needed to alleviate many of the problems associated with the prior art.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed to a semiconductor thermal processing system and a method for thermally processing a semiconductor wafer or substrate. The thermal processing system is operable to heat a substrate in vacuum or various gases to achieve desired physical and chemical changes for semiconductor device fabrication in an innovative manner to ensure improved thermal processing performance of a substrate.

According to one aspect of the present invention, a semiconductor thermal processing system and associated method is disclosed which provides a heater chamber and a process chamber, wherein the heater chamber and process chamber are environmentally isolated from one another by a thermally-transparent plate. The thermally transparent plate is generally transmissive to thermal radiation. A heater assembly comprising one or more quasi-continuous heater elements is situated in the heater chamber, whereby a linear translation assembly is operable to linearly move the heater assembly in a direction generally perpendicular to the wafer in the process chamber. A power supply is operable to provide heating current to the one or more heater elements, thereby emitting thermal radiation through the thermally-transparent plate toward a substrate situated within the process chamber.

According to another exemplary aspect of the present invention, one or more temperature sensors are operable to measure one or more temperatures associated with one or more respective locations on the substrate. A controller operably coupled to the heater assembly, linear translation assembly, and the one or more temperature sensors is operable to control the thermal radiation emitted by the one or more heater elements, as well as a distance between the heater assembly and the substrate. The control is based, at least in part, on the one or more measured temperatures.

According to yet another exemplary aspect of the present invention, the one or more heater elements comprise one or more heater rings, wherein the thermal radiation emitted by each of the one or more heater rings is individually adjustable, thereby making the heater assembly radially-tunable. A distance between each of the one or more heater rings and the substrate is furthermore adjustable, wherein the one or more heater rings can be situated in a common plane, or at varying distances from the substrate.

According to still another aspect of the invention, the linear motion of the heater assembly is primarily used to control the overall heating level, namely the temperature of a substrate (e.g., a silicon wafer) in the process chamber. The temperatures of the one or more heater rings are adjusted or tuned independently to control the thermal radiation power emitted by the one of more heater rings in order to tune the radial thermal radiation profile of the heater assembly and achieve the uniform heating across the substrate. One or a plurality of the heater rings can tilt independently with respect to the normal direction of the substrate for further tuning of thermal radiation profile of the heater assembly.

According to still another exemplary aspect of the invention, the thermal processing system can be operated under the control of an automation network comprising (1) sensors for temperature, position and pressure monitoring, (2) signal processing electronic circuitry and computer with proper algorithm or modeling software, and (3) electrical, mechanical and pneumatic driving units or controllers for the linear motion of the heater assembly and the heating powers to the one or more heater rings. The control network is operable to control the thermal radiation emitted by the heater assembly based on both the desired processing temperature and duration and the one or more measured temperatures from the substrate. The thermal radiation power of the heater assembly is controlled by varying the voltage or current delivered to the one or more heater rings from the power supplies. The total amount of thermal radiation received by the substrate under processing is controlled by adjusting the distance between the heater assembly and the substrate through the linear motion of the heater assembly. The control network is operable to control the composition, pressure, duration and switching of the ambient gas around the substrate in synchronization with the temperature versus time profile of the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
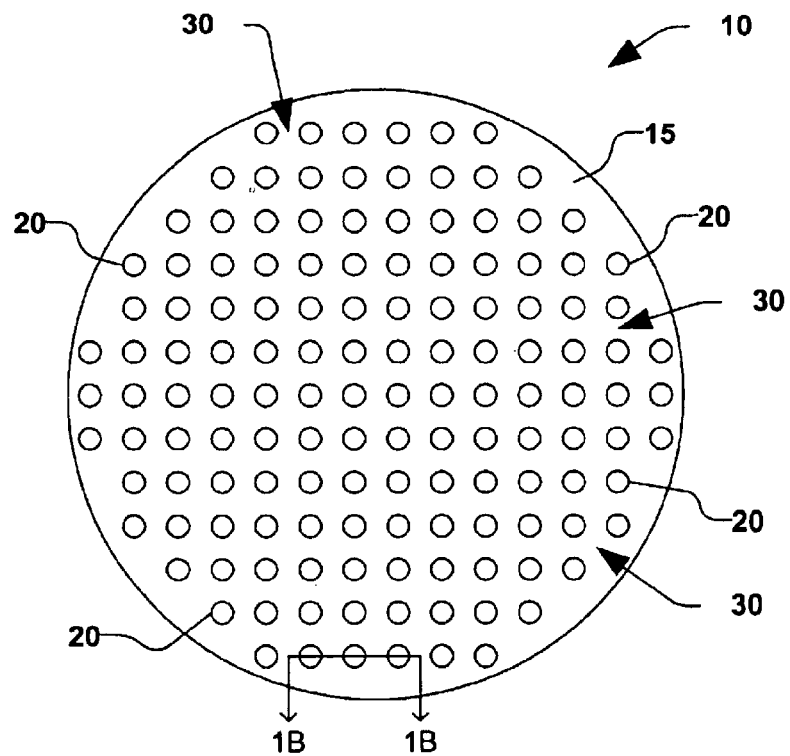
FIG. 1A is a plan view of a prior art thermal processing system illustrating a plurality of light-emitting lamps.
Figure 1B:
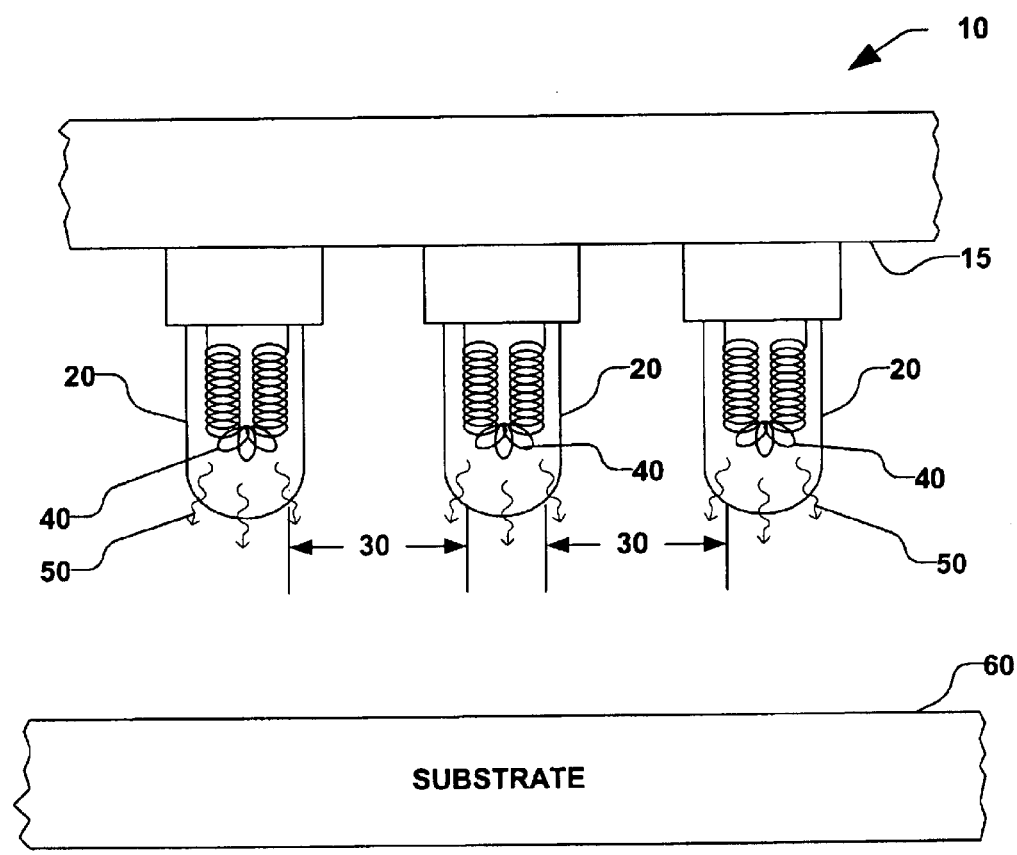
FIG. 1B is an exploded, fragmentary cross-sectional view of the prior art thermal processing system illustrated in FIG. 1A.

The present invention is directed towards a rapid thermal processing (RTP) system and an associated method that incorporates several inventive features that improve the thermal performance of the RTP system, reduce temperature variations over a substrate under rapid thermal processing, and improve process control therein. The proposed RTP system facilitates powerful and flexible temperature control, variable gas ambient pressure, quick process gaseous ambient switching and vibration-free pyrometric temperature sensing. The proposed RTP system is suitable for several important RTP applications, including (1) multi-step and multiple ambient rapid thermal processing (RTP), (2) rapid thermal chemical vapor deposition (RTCVD), (3) low pressure chemical vapor deposition (LPCVD) and (4) atomic layer deposition (ALD), etc.

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
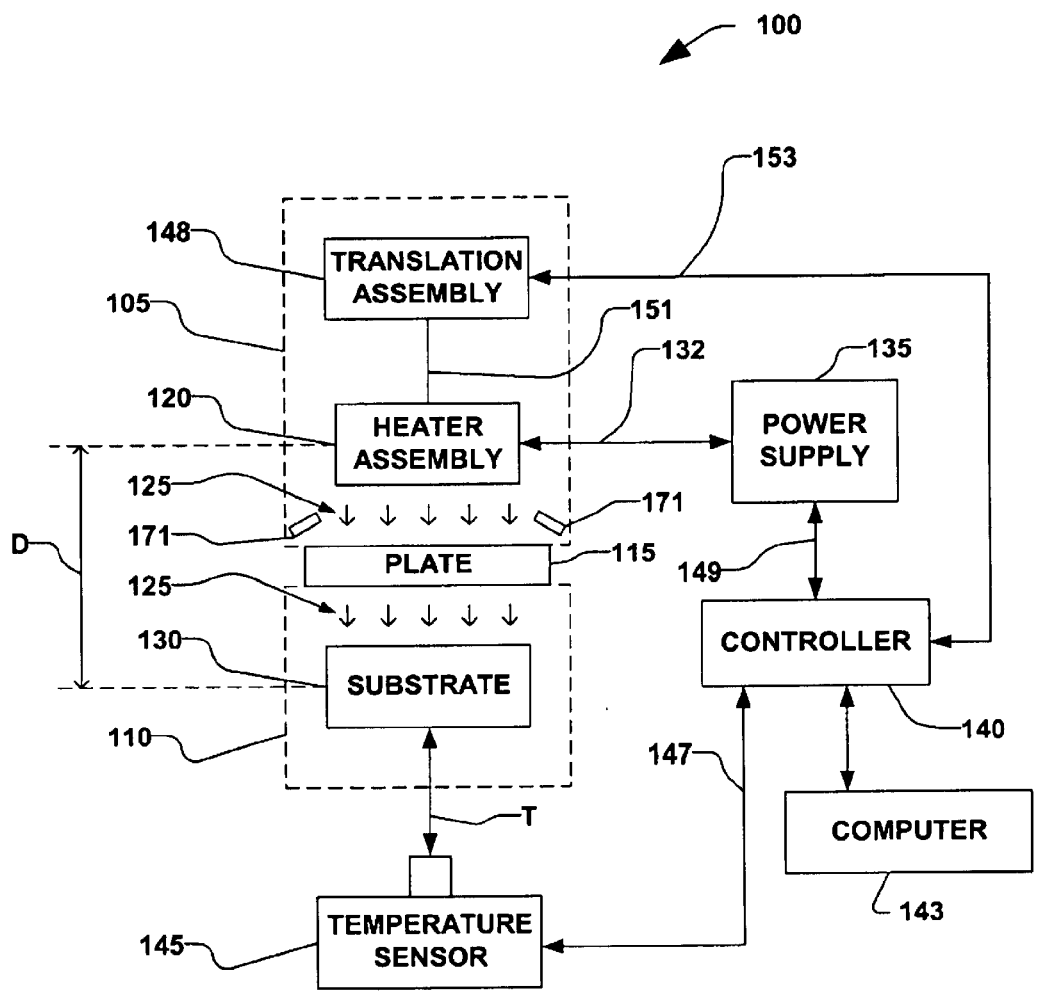
FIG. 2 is a system level block diagram of a thermal processing system according to one aspect of the present invention.

One aspect of the present invention provides a thermal processing system comprising a linearly-moving quasi-continuous and radially-tunable heat source, wherein the heat source is operable to uniformly heat a semiconductor substrate. FIG. 2 schematically illustrates an exemplary thermal processing system 100 comprising a heater chamber 105 and a process chamber 110 separated by a thermally-transparent plate 115. The heater chamber 105 comprises a heater assembly 120 disposed therein, wherein the heater assembly is operable to emit thermal radiation 125 which transmits through the thermally transparent plate 115 toward a substrate 130 disposed in the process chamber 110. The thermal radiation 125 emitted by the heater assembly 120 consequently heats the substrate 130 during the operation of the thermal processing system 100. Typically, the thermal processing system 100 can heat the substrate 130 to a wide range of temperatures (e.g., from about room temperature to about 1300° C.) according to a pre-defined temperature versus time profile that is synchronized with a desired sequence of ambient gases around the wafer.

According to one exemplary aspect of the present invention, the heater assembly 120 is resistively heated by electrical current 132 provided by one or more power supplies 135, whereby an amount of electrical current from the one or more power supplies is generally determined by a central control unit 140. The thermal processing system 100 further comprises one or more temperature sensors 145 operable to measure one or more temperatures T at one or more respective locations associated with the substrate 130. The one or more temperature sensors 145 are further operable to relay signal(s) 147 indicative of the one or more measured temperatures T to the central control unit 140. The central control unit 140 is furthermore operable to control the amount of electrical current 132 supplied to the heater assembly 120 via the power supply 135, wherein the control is based, at least in part, on the signal(s) 147 associated with the one or more measured temperatures T, the distance D between the heater assembly 120 and the substrate 130, and the desired temperature versus time profile. The central control unit can be interfaced to a host computer 143 for automation.

According to another exemplary aspect of the invention, the thermal processing system 100 further comprises a translation assembly 148 operably coupled to the heater assembly 120 and the central control unit 140, whereby the translation assembly is operable to vary a distance D between the heater assembly 120 and the substrate 130. The translation assembly 148 can be physically coupled to the heater assembly 120 via a shaft 151, whereby the translation assembly is operable to linearly drive the shaft and move the heater assembly 120 away from or towards the process chamber 110, thereby varying the distance D between the heater assembly 120 and the substrate 130. According to one exemplary aspect, the translation assembly 148 further comprises a positional sensing device (not shown), whereby a linear position of the heater assembly 120 relative to the substrate 130 is monitored and fed back to the central control unit 140, thus providing a closed-loop feedback control regarding the position of the heater assembly 120. Furthermore, the control of the linear position is based, at least in part, on the signal(s) 147 associated with the one or more measured temperatures T on the substrate 130 and the desired temperature versus time profile for the substrate.

The central control unit 140, for example, generates one or more control signals 149 to implement feedback control for heating the substrate 130 in the process chamber 110. The control signals 149 can comprise, for example, power control signals to the power supply 135 to control the thermal radiation power and profile of the heating assembly 120, and linear-motion drive signals 153 to the translation assembly 148 to control the distance D between the heater assembly 120 and the substrate 130. The central control unit 140 may comprise a closed-loop multi-channel feedback control system for use in process control. Control functions, for example, may furthermore be carried out by a dedicated computer system 143. Generally, the combination of the controller 140 and the computer 143 is used to control and optimize both the linear motion and the thermal radiation radial profile of the heater assembly 120 based upon the readings from temperature sensor(s) 145 and the pre-defined temperature versus time profile for rapid thermal processing. In principle, with a few simplified assumptions, the optimal thermal radiation profile of the heater assembly 120 for the uniform heating of the substrate 130 can be determined directly from the measured substrate temperatures T.

Figure 3:
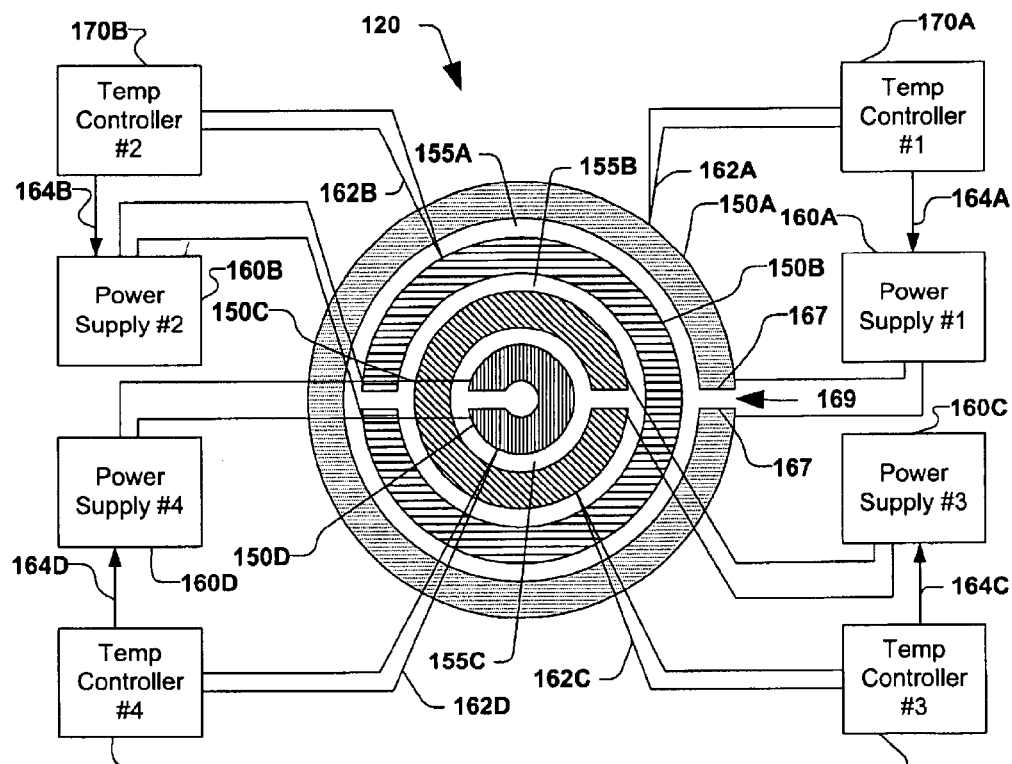
FIG. 3 is a simplified plan view of an exemplary heater assembly and power control system according to one aspect of the present invention.

Referring now to FIG. 3, an exemplary heater assembly 120 is illustrated in plan view, wherein the heater assembly comprises one or more coaxial circular quasi-continuous heater elements 150 made of high-temperature conductor or semiconductor materials such as silicon carbide (SiC), graphite, boron nitride (BN), molybdenum silicide (MoSi$_2$), refractory metals (e.g., tungsten), metal alloys and the like. Each heater ring is symmetric with respect to its axis except a small opening. The two terminals at the opening are used as two electrodes for electrical current from a power supply 160 to flow in and out the heater ring loop. The cross-section of a heater ring can be circular, triangular, rectangular, square or other shapes. There is at least one temperature sensor 162 attached to or associated with each heater ring 150 to measure the heater ring temperature and feed the temperature signal into at least one temperature controller 170. The temperature sensor(s) 162 can be of contact-type (e.g., thermal couples) and remote temperature (e.g., pyrometers) sensors.

Based on the measured heater ring temperatures and the optimal heater ring temperatures for a desired radial profile of thermal radiation, the temperature controllers 170 generate control signals 164 for their respective power supplies 160 to control the temperatures of their respective heater rings. Preferably, the heater rings are operated in vacuum to eliminate heat transfer or loss via convection and conduction, and to prevent the heater rings from degrading due to gas-surface reactions. In this exemplary case, the heat transfer mechanism between heater rings in vacuum and their environment is primarily thermal radiation.

The total thermal radiation power P (in Watts) emitted by a unit area (in cm$^2$) on a hot surface at an absolute temperature T (in Kelvin) can be calculated using the Stefan-Boltzmann law:

$$P = \epsilon \sigma T^4,$$

where $\epsilon$ is the emissivity of the heater ring surface and $\sigma$ is the Stefan-Boltzmann radiation constant with a value of $5.6697 \times 10^{-12}$ Watts·centimeter$^{-2}$·Kelvin$^{-4}$. Each heater ring gives a uniform annular temperature distribution when driven by an electrical current along the ring. The heater ring assembly 150 can be parallel to and coaxial with the substrate (not shown). The outer diameter of the largest heating ring 150A can be comparable with or significantly larger than that of the substrate being heated.

Still referring to FIG. 3, the ratios of the heating ring widths to the inter-ring gap widths or the insulator spacer widths 155 can be as large as possible in order to maximize the total thermal radiation emitting area of the heater rings relative to the total gap area as viewed from the substrate under processing. The much larger total thermal radiation emitting area of the heater assembly 120 is clearly advantageous over the prior art lamp assembly of FIG. 1A which has a much smaller total thermal radiation emitting area. In the prior art illustrated in FIG. 1A, the spacing 30 between individual filaments of lamps 20 may cause a non-uniform thermal profile at the substrate (not shown) if not compensated for by additional lenses, reflectors, or the like. The present invention, however, overcomes the limitations of the prior art by providing a quasi-continuous heat emitting surface that is axis-symmetric, and that allows the radial thermal radiation profile to be tuned, whereby equal amounts of thermal radiation are received at all positions of a substrate.

Note that quasi-continuous in the present invention includes an element that is spatially continuous about at least a substantial portion thereof. For example, for the heater rings illustrated in the above example, the rings are a generally solid, continuous ring for a substantial amount of the circumference, having a small gap associated therewith. In the above manner, the quasi-continuous heater rings differ substantially from the prior art solutions employing a large number of discrete filaments.

As illustrated in FIG. 3, the one or more heater rings 150 are operable to emit thermal radiation, with energy being provided electrically from the one or more heater power supplies 160. In order to electrically isolate the heater rings from one another so that the temperature of each heater ring can be varied independently by adjusting the electrical current through each heater ring, insulation ring spacers or gaps 155 can be utilized to separate the adjacent heater ring elements. The quasi-continuous radially-tunable heater assembly may take several forms. It will be understood by one of ordinary skill in the art that any variety of shapes of the quasi-continuous heater elements 150 can be utilized in the present invention, and are considered to fall within the scope of the present invention.

In another alternative aspect of the invention, one or more discrete heating elements such as filament type lamps may be individually controllable to move relative to the substrate to control the heating level for a substrate. Alternatively, one or more subgroups of discrete heating elements are controllable to move independently with respect to the substrate to control the substrate heating level. In the above manner, the thermal radiation profile of the heater assembly comprising discrete heating elements or subgroups of discrete heating elements may be controlled to achieve a uniform temperature on the substrate.

Figure 4A:
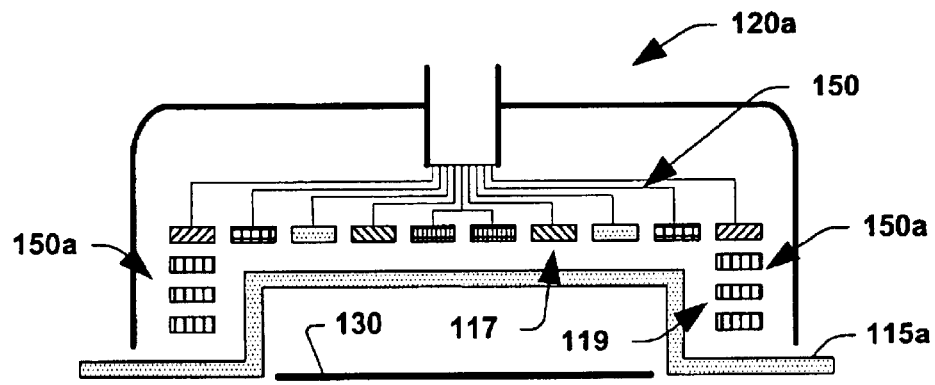
FIGS. 4A and 4B are cross sectional views illustrating exemplary alternative heater assembly arrangements in accordance with other aspects of the present invention.
Figure 6:
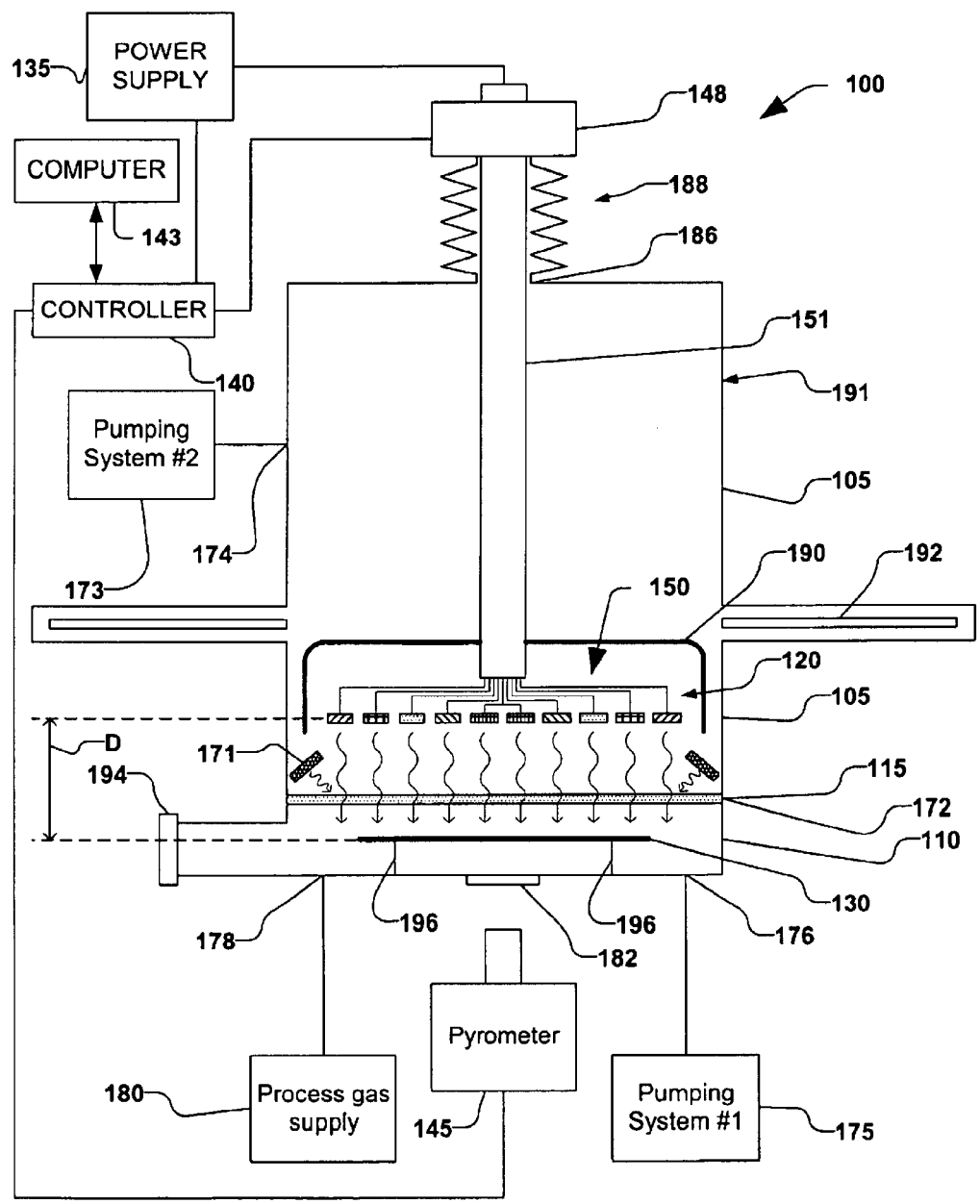
FIG. 6 is a cross-sectional view of an exemplary thermal processing system where the heater assembly is heating the substrate at a lower position according to one aspect of the present invention.
Figure 7:
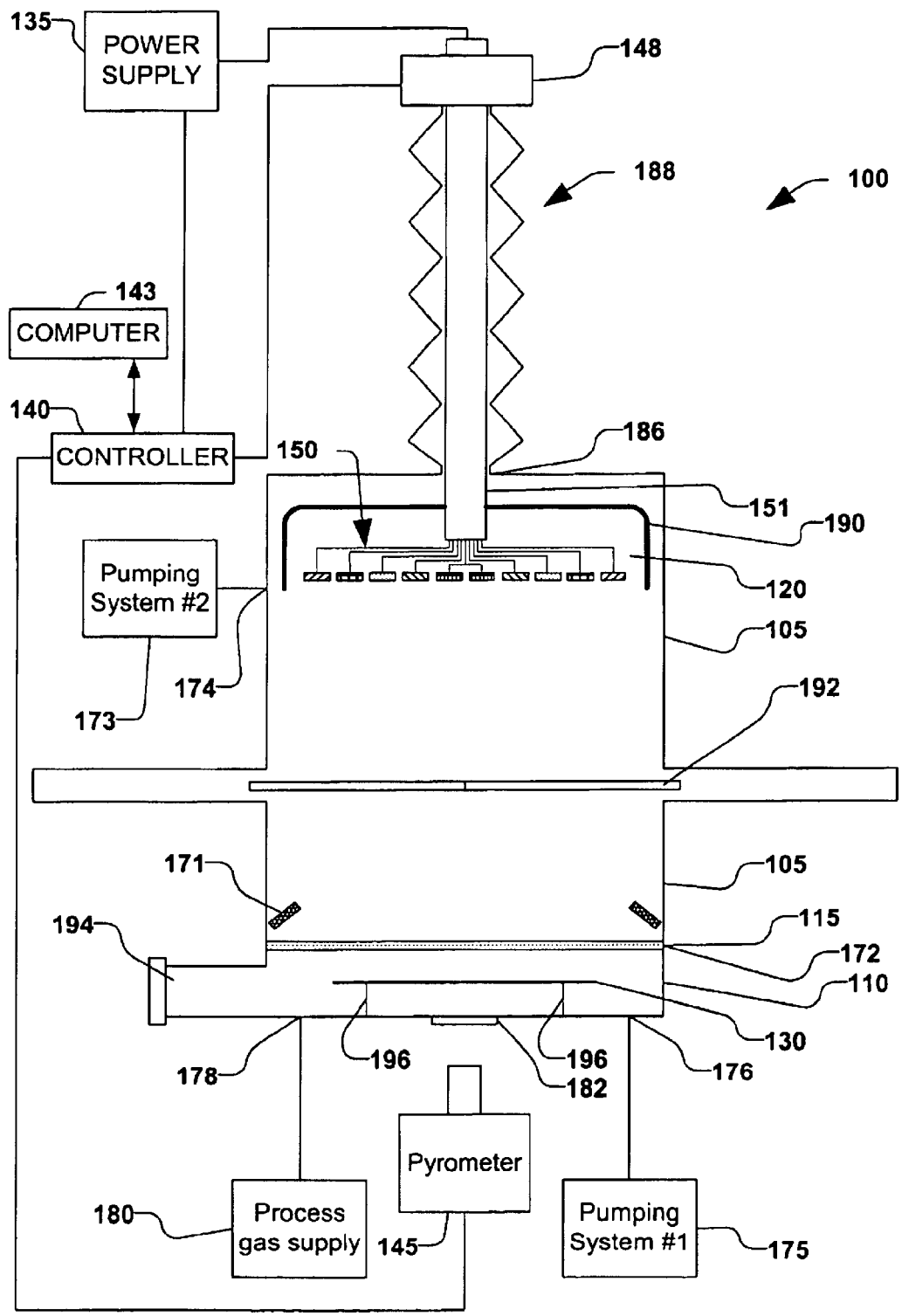
FIG. 7 is a cross-sectional view of an exemplary thermal processing system where the heater assembly is at a retracted home position according to one aspect of the present invention.

In accordance with one aspect of the present invention, various types of heater assembly arrangements 120 may be employed, and such alternatives are contemplated as falling within the scope of the present invention. For example, in addition to the heater assembly 120 that is illustrated in FIGS. 6 and 7 and will be discussed in greater detail with respect therewith, heater assemblies 120a and 120b illustrated in FIGS. 4A and 4B may be employed. As illustrated in FIG. 4A, the heater assembly 120a is composed of heating rings arranged into a cylindrical profile. The heater ring assembly 150 can be lowered sufficiently so that the substrate 130 is completely inside the enclosure of the heater ring assembly 150. Accordingly, the thermally-transparent plate 115a that separates the process and the heater chambers is no longer flat. The horizontally-aligned heater rings 117 provide a radially-tunable thermal radiation profile in a similar fashion to the heating assembly 120 illustrated in FIG. 3. The vertically-aligned largest heater rings 119 can provide additional tuning of thermal radiation profile of the heater assembly and, particularly, improve the heating along the edge of the substrate 130.

Figure 4B:
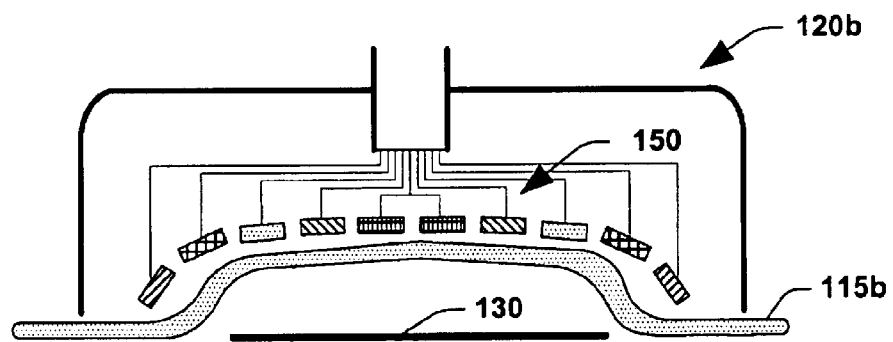

In another exemplary alternative, FIG. 4B illustrates another heater assembly 120b, wherein the wafer is isolated by a dome-shaped thermally transparent plate 115b. Surrounding the plate 115b, a plurality of heater elements 150 are positioned and oriented to generally follow a contour associated with the plate 115b. It should also be noted that the central heater elements 150b illustrated herein as well as in FIG. 3 may be small, individual disks, but may also include a small zig-zag pattern, spiral pattern or other heater element configuration to ensure a uniform thermal radiation characteristic, as may be desired. By having the various heater elements individually controllable, a radially tunable thermal profile may be obtained at the substrate. It should be noted that the assemblies 120a and 120b illustrated in FIGS. 4A and 4B are provided by way of example, and that it should be understood that various other types of heater assembly configurations may be employed and such alternatives are contemplated as falling within the scope of the present invention.

A heater ring 150 can be resistively heated by electrical current from a single power supply as shown in FIG. 3. Alternatively, a heater ring 150 may be powered in segments by multiple outputs from a single power supply or by multiple power supplies (see, e.g., FIG. 5). It will be understood by one of ordinary skill in the art that there are many different electrical connection configurations or methods to uniformly heat a conductor or semiconductor ring, or to heat different segments of a heater ring to different temperatures, and these methods are contemplated as falling within the scope of the present invention.

Figure 5A:
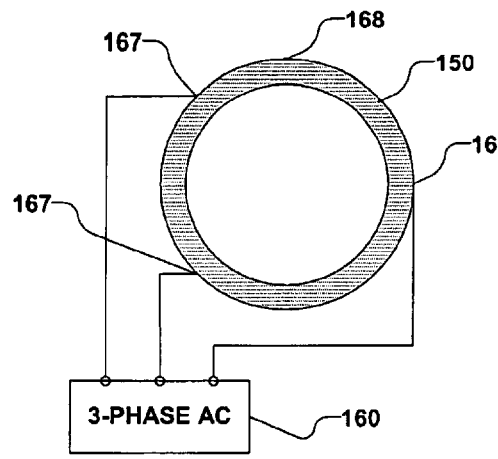
FIGS. 5A–5D are simplified plan views of power connections to a heater element according to one aspect of the present invention.
Figure 5B:
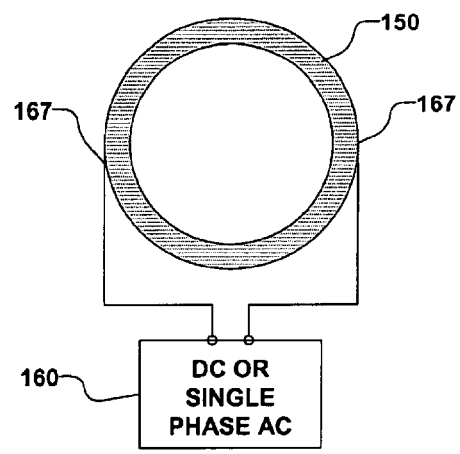
Figure 5C:
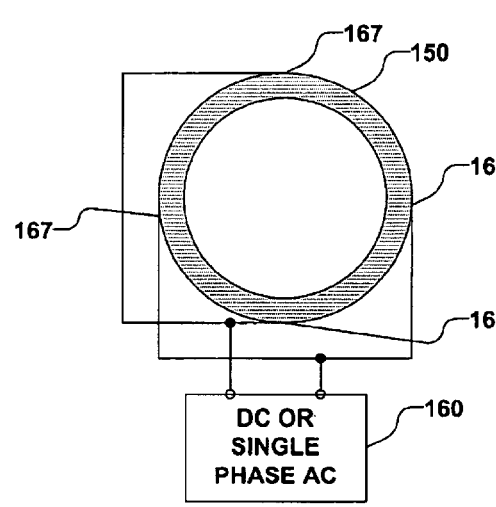
Figure 5D:
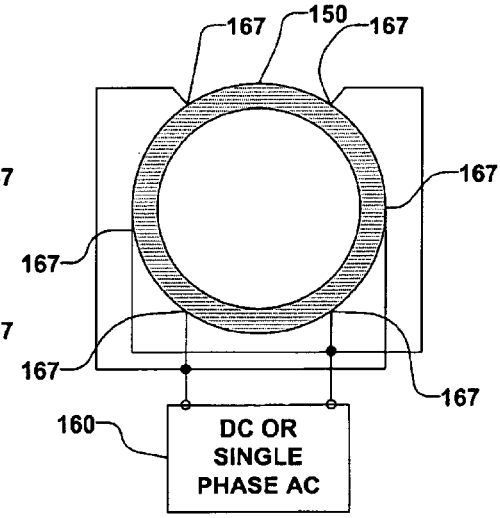

FIGS. 5A–5D illustrate several exemplary configurations for connecting a power supply 160 to a heater ring 150. FIG. 5A, for example, illustrates an exemplary 3-phase alternating current (AC) power supply 160 connected to the heater ring 150 at three distinct locations 167. The three distinct locations 167 are, for example, equally spaced around a circumference 168 of the heater ring 150 in order to balance the resistances between the three segments as defined by the three connecting locations 167. FIG. 5B illustrates a direct current (DC) or single-phase AC power supply 160 connected to two distinct locations 167 located opposite one another on the heater ring 150. Alternatively, a heater ring can be configured as illustrated in FIG. 3 where the two terminals at the small opening in a heater ring are used as electrodes where electric current can be input and drained. FIG. 5C illustrates a DC or single-phase AC power supply 160 connected to four distinct locations 167 on the heater ring 150, wherein power is split between the four segments. Finally, FIG. 5D illustrates a DC or single-phase AC power supply 160 connected to six distinct locations 167 on the heater ring 150, wherein power is split between the six segments. Accordingly, any number of connections from the power supply 160 to the heater ring 150 is contemplated as falling within the scope of the present invention. In addition, a heater ring element can be made by wrapping one or more high-temperature conductor and semiconductor wires or ribbons around one or more supporting circular frames in a number of ways.

Referring again to FIG. 3, according to another exemplary aspect of the present invention, the heater assembly 120 is radially-tunable, wherein a current provided to each of the one or more heater rings 150 by the one or more power supplies 160 is individually adjustable. Such adjustment permits fine-tuning of a thermal radiation profile emitted by the heater assembly 120. Furthermore, a temperature controller 170 may be associated with each heater ring 150, wherein the temperature controller 170 is operable to maintain the temperature of each respective heater ring via the respective power supply 160. The temperature controller 170 associated with each respective heater ring 150, for example, can employ a PID-type controller utilizing a set point temperature pre-determined by the controller 140 of FIG. 2, and wherein control inputs 147 are the temperatures T associated with the substrate 130, as well as any associated offsets. Other types of temperature controllers and methods can also be employed.

According to yet another exemplary aspect, the one or more heater rings 150 are coaxial in a common plane (FIGS. 3, 5 and 6). Alternatively, the one or more heater rings 150 can be located coaxially in different planes parallel to each other. In other words, the distances from the heater rings 150 to the substrate 130 can vary from each other, whereby the thermal radiation profile emitted by the heater assembly 120 can further be tuned axially. For example, heater rings 150A–150D can be adjusted such that heater ring 150A is closest to the substrate (not shown), heater ring 150B is farthest from the substrate, and heater rings 150C and 150D have intermediate distances from the substrate, etc. A multitude of variations in distances between the individual heater rings 150 to the substrate can be performed, and all such variations are contemplated as falling within the scope of the present invention.

According to yet another exemplary aspect, one or a plurality of the heater rings 150, or the entire heater assembly 120, can be tilted independently with respect to the normal direction of the substrate for further tuning of thermal radiation profile emitted from the heater assembly 120. The orientation of a heater ring can be conventionally defined by its polar and azimuthal angles with respect to the normal direction of the substrate 130.

According to yet another exemplary aspect of the present invention, the thermal processing system 100 of FIG. 2 further comprises one or a plural auxiliary heater rings 171 disposed within the heater chamber 105, wherein the auxiliary heater rings are operable to compensate for the relatively weak thermal radiation received by the edge of the substrate 130. The auxiliary heater ring 171, for example, is coaxial with the substrate 130, and furthermore can have a diameter comparable with or larger than the diameter of the substrate. Alternatively, the auxiliary heater ring 171 can reside within the process chamber 110. The auxiliary heater ring can be stationary with respect to the process chamber 110. Instead of adjusting its distance to the substrate 130, the temperature of the auxiliary heater ring 171 can be dynamically controlled in synchronization with both the distance D from the heater assembly 120 to the substrate 130 and the radial thermal profile of the heater assembly so that the uniform heating of the substrate 130 can be achieved.

Referring now to FIG. 6, an exemplary thermal processing system 100 is illustrated wherein the thermally transparent plate 115 generally separates the heater chamber 105 from the process chamber 110. The thermally transparent plate 115 is generally made of high-temperature materials that are transmissive to thermal radiation such as quartz, sapphire or the like. The thermally transparent plate 115 should have sufficient mechanical strength to sustain the pressure difference between the heater chamber 105 and the process chamber 110. Accordingly, a seal mechanism 172 is deposed about the thermally transparent plate 115, the heater chamber 105 and the process chamber 110, and the seal 172 is operable to prevent any gas exchange between the heater chamber 105 and the process chamber 110. The heater chamber 105 is pumped with a gas pumping system 173 to achieve a low-pressure or vacuum in order to reduce or prohibit thermal conduction and convection between the heater assembly 120 and its environment. Alternatively, an inert gas such as argon (Ar) can be fed into the heater chamber through a proper gas inlet (not drawn) to reduce the pressure difference between the two sides of the transparent plate 115.

According to another aspect of the present invention, a first pumping system 175 evacuates gases from the process chamber 110 via a vacuum port 176 at controlled pumping speed. The pumping speed can be continuously adjusted by using a conventional butterfly valve or the like. A process gas supply 180 introduces one or a plurality of gases at controlled flow rates into the process chamber via a gas input 178. Multiple gases can be input into the process chamber simultaneously or sequentially. By controlling the gas pumping speed and input flow rates of all the gases, the total pressure of the process chamber 110 as well as the fractional pressures of all the ambient gases can be regulated in a wide range of pressure, e.g., less than about $10^{-6}$ torr to about 1 atmosphere or more. The process gases can include, for example, $H_2$, $H_2O$, $O_2$, $O_3$, halogen containing gases or vapors (e.g., $Cl_2$, HCl), interhalogen molecules (e.g., ICl), nitrogen containing gases or vapors (e.g., NO, $N_2O$, $NH_3$), Si, Ge, B, P, As and Ga containing chemical vapor deposition precursors, metal (e.g., Al, W, Cu, Ti, Co, Ta) containing gases or vapors, metal organic chemical vapor deposition precursors, and gases containing electrons, ions, atoms or radicals.

According to yet another exemplary aspect of the present invention, the temperature sensor 145 comprises one or a plurality of remote or non-contact type temperature sensors, for example, optical pyrometer(s). The remote temperature sensor(s) 145 may comprise one or a plurality of detection channels to measure one or more temperatures T at one or more locations on the substrate 130 through one or more optical paths such as optical windows, optical fibers or light pipes 182. In operation, the measured temperatures of the substrate 130 from the remote temperature sensors are operably fed into the controller 140.

According to yet another aspect of the invention, the temperature sensor can be of a contact type, for example, a temperature reading device with a temperature sensor (e.g., a voltage-measuring device with a thermocouple) or the like. The temperature sensor, in one example, requires a physical path for electric wires (not shown) to extend from the substrate 130, through the process chamber wall to the temperature reading device. The contact-type temperature sensor can make contact with the substrate 130, or maintain a predetermined distance from the substrate 130, to measure the temperature thereof. The structural and operational details of various contact-type temperature sensors (e.g., a thermocouple) are known to one of ordinary skill in the art, and will therefore not be further discussed herein.

According to yet another exemplary aspect of the invention, the translation assembly 148 is physically coupled to the heater assembly 120 via a shaft 151 to linearly translate the heater assembly 120 along the normal direction of the substrate 130 in the process chamber 110, thereby varying the distance D between the heating assembly 120 and the substrate 130. The heater chamber 105, for example, comprises an opening 186 through which the shaft 151 passes. A mechanical driving unit such as an electric motor, a hydraulic pump, an air compressor, a solenoid, a piezoelectric driving unit and the like, as well as their respective motion transmission accessories (not shown), can lift and lower the translation assembly 148.

A bellow 188 can be used to physically couple the translation assembly 148 to the opening 186 in the heater chamber 105 via vacuum seals to preserve the vacuum integrity of the heater chamber 105. The heater assembly 120 is mounted at the lower end of the shaft 151 and moves, together with the shaft 151 and the translation assembly 148, with respect to the substrate 130 in the process chamber 110. Furthermore, according to another exemplary aspect of the invention, the translation assembly 148 further comprises a positional sensing device (not shown), whereby the distance D between the heater assembly 120 and the substrate 130 is measured and transmitted to the controller 140.

According to still another exemplary aspect of the invention, the heater assembly further comprises a thermal shield 190. The thermal shield 190 can have a reflective surface to reflect thermal radiation toward the substrate 130 and the heater elements. The thermal shield 190 can have a thermal radiation absorbing surface to absorb thermal radiation from the heater assembly 120 which is not directed toward the substrate. The use of a thermal shield 190 suppresses the unwanted heating of the heater chamber 105 walls and increases heating efficiency of the heater assembly 120. The thermal shield 190 can be actively cooled by flowing gas or liquid through, and actively heated with heating elements so that the temperature of the thermal shield 190 can be regulated at a desired level.

According to another exemplary aspect of the present invention, a shutter 192 may be utilized to block thermal radiation from the heater assembly 120 to the substrate 130 in the process chamber 110 when the heater assembly 120 is above the shutter. In FIG. 6, the shutter 192 is illustrated in an open position, whereby the heater assembly 120 can be lowered so that thermal radiation from the heater assembly can heat the substrate 130. In contrast, FIG. 7 illustrates the heater assembly 120 in a retracted position, and the shutter 192 is closed. In the retracted position, the heater assembly 120 resides above the shutter 192 which blocks thermal radiation from the heater assembly 120 to the substrate 130 in the process chamber 110.

A conventional load lock mechanism may be utilized for inserting and removing the substrate 130 into and out of the process chamber 110 through a gate 194. Upon insertion into the process chamber 110, the substrate may be placed upon supporting features such as narrow pins 196, wherein the narrow pins, for example, are comprised of silicon carbide, quartz or ceramic. The pins 196 can be affixed to the process chamber 110, and provide support for the substrate 130 during processing. The supporting features 196 can also rotate the substrate 130 along its axis for further improved temperature uniformity.

FIGS. 6 and 7 illustrate the system 100 of the present invention in one exemplary context, however, it should be understood that numerous variations may be employed and such variations are contemplated as falling within the scope of the present invention. For example, the system 100 could be employed "upside-down", wherein the process chamber 110 containing the wafer 130 are vertically oriented above the heating chamber 105, and wherein the heating assembly 120 moves vertically below the substrate 130.

In another arrangement, the process chamber 110 may be sandwiched between two radially-tunable heater assemblies in one or two separate heating chambers in a vertical type arrangement. In such an arrangement, the two radially tunable heating assemblies 120 may be moved independently or synchronously relative to the substrate 130. The two heating assemblies could contribute equally to substrate heating, or may operate in a primary/secondary heating relationship, wherein one could tune as a coarse temperature adjustment and the other as a fine temperature adjustment. In yet another alternative arrangement, one assembly may provide radial tuning capabilities while the other may provide non-radial tuning capabilities.

In addition to the various vertical arrangements highlighted above, the present invention further contemplates horizontal type arrangements, for example, wherein a process chamber 110 and one or two heating chambers are arranged horizontally. Further, such a horizontal arrangement may include multiple heating assemblies, for example, wherein the substrate 130 is sandwiched between two heating assemblies 120 or surrounded by multiple assemblies, respectively. In yet another aspect of the invention, temperature sensing may be performed at additional or alternative locations, for example, by employing a light pipe that is co-axial with the heating assembly 120 and the shaft 151.

This and other alternative temperature sensing locations or arrangements and other orientations of the thermal processing system are contemplated as falling within the scope of the present invention.

The present invention is also directed toward a method for thermally processing a semiconductor substrate. While exemplary methods are illustrated and described herein as a series of acts or events, it will be appreciated that the present invention is not limited by the illustrated order of such acts or events, as some steps may occur in different orders or concurrently with other steps apart from that shown and described herein, in accordance with the invention. In addition, not all illustrated steps may be required to implement a thermal processing in accordance with the present invention. Moreover, it will be appreciated that the methods may be implemented in association with the systems illustrated and described herein as well as in association with other systems not illustrated.

Figure 8:
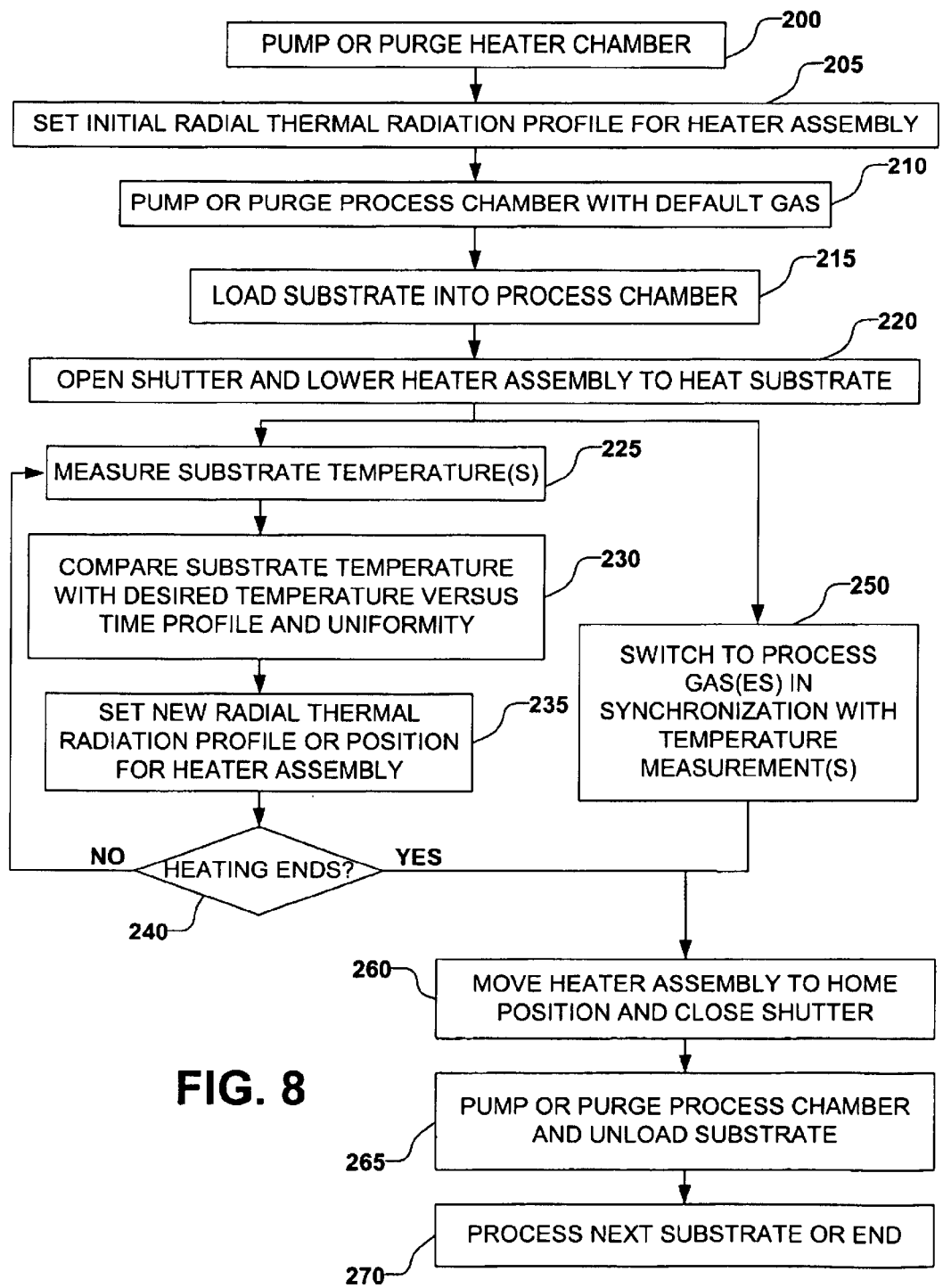
FIG. 8 is a flow chart diagram illustrating an exemplary methodology for thermally processing a semiconductor substrate according to the present invention.

FIG. 8 illustrates a method of thermally processing a semiconductor substrate according to one exemplary aspect of the present invention. In act 200, the heater chamber is pumped to vacuum or purged with an inert gas at an appropriate pressure for the safe operation of a radially-tunable heater assembly at high temperatures. In step 205, an initial thermal radiation profile is established by supplying each heating element with an adequate amount of electrical power. The thermal radiation profile can be monitored via the temperature sensors associated with the heating elements and using the Stefan-Boltzmann law.

The process chamber is pumped with vacuum pumps or purged with a default gas at an appropriate pressure (step 210). Then a substrate is loaded into the process chamber manually or by a robotic arm (step 215). The shutter is opened so that thermal radiation from the heater assembly transmits through the thermally-transparent plate and irradiates onto the substrate. The heater assembly starts to lower towards the substrate (step 220). This initiates a thermal processing cycle as pre-defined by a substrate temperature versus time profile combined with synchronized gas ambient switching and control. A gas ambient is typically characterized by gaseous composition, pressure, flow rate and gas-substrate interaction time. During thermal processing, multiple gases can be used sequentially or simultaneously around the substrate in synchronization with substrate temperature (step 250).

In step 225, one or more temperatures associated with one or more respective locations on the substrate are measured. A comparison with a pre-defined substrate temperature versus time profile and temperature uniformity is then made in step 230.

Depending on the difference between the measured substrate temperatures and the desired temperature and temperature uniformity, various adjustments can be made to the thermal processing system in step 235. If the average temperature of the substrate is lower/higher than the desired temperature, the heater assembly can be moved towards/away from the substrate to raise/reduce the total heating power received by the substrate. Alternatively, the temperatures of all heater rings in the heater assembly can be raised/lowered so that the total power of thermal radiation emitted from the heater assembly is increased/decreased. If the average temperature along a circle of radius R1 on the substrate is relatively lower/higher than the temperature averaged over the entire substrate, the temperature of the heating ring that has a radius closest to R1 can be selectively increased/decreased to improve the temperature uniformity of the substrate. If the temperature along a circle of radius R2 on the substrate is tilted or varied towards one direction with respect to the substrate normal and the substrate does not rotate, the heating ring that has a radius closest to R2 can be tilted along the same direction as the temperature tilting to improve the temperature uniformity of the substrate.

Steps 225, 230 and 235 can be cyclically carried out at constant or varying time intervals until the substrate has been processed with the pre-defined temperature versus time profile (step 240). In parallel with the temperature control of the substrate, the substrate can be exposed to one or multiple process gases with controlled chemical compositions during a thermal processing cycle. Such exposure can be realized by switching the process gas from one to another in synchronization with the substrate temperature (step 250).

As soon as the process is complete, the heater assembly is moved away from the substrate to its home position and, subsequently, the shutter is closed to block thermal radiation from the heater assembly to the substrate in step 260. The process chamber can then be pumped by vacuum pumps or purged with the default gas before the substrate is unloaded from the process chamber (step 265). The thermal processing system is then ready for processing the next substrate or discontinues operation (step 270).

In conjunction with the system and method highlighted above, the control of the heater assembly based on thermal information relating to the substrate is discussed. It should be understood that any type of control system and methodology may be employed above, and such systems and methods are contemplated as falling within the scope of the present invention. For example, the computer 143 may be employed to actively control the distance between the heater assembly 120 and the substrate 130 to follow the desired temperature versus time profile during processing while adjusting the temperatures of all the heater rings to achieve uniform heating of the substrate. This control may be achieved, for example, using multi-channel closed-loop feedback and control if substrate temperatures are monitored at multiple substrate locations and the correlation of substrate temperature at any location to the thermal radiation emitted from each heating elements are sufficiently understood.

If, for example, the substrate temperature is monitored at a single location, the temperature of the heater rings can be predetermined and optimized for uniform substrate heating at various heater assembly-to-substrate distances. This may be accomplished by pre-calibration by using, for example, a test substrate embedded with multiple temperature sensors (e.g., thermocouples) at a number of positions. The pre-calibration data may then be used to program the radial thermal profile of the heater assembly as a function of the heater assembly-to-substrate distance while the distance is controlled by a closed substrate temperature feedback and control loop to follow the desired temperature profile for substrate processing. In yet another alternative, the temperatures of all the heater rings can be fixed at optimal values while varying the heating assembly-to-substrate distance for substrate temperature control. These and other control systems and methodologies may be employed and are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A thermal processing system, comprising:
   a heater chamber;
   a process chamber;
   a generally thermally-transparent plate separating the heater chamber and the process chamber;
   a heater assembly disposed within the heater chamber, the heater assembly comprising one or more quasi-continuous heater elements, wherein the one or more heater elements are operable to emit thermal radiation that transmits through the thermally-transparent plate toward a substrate disposed in the process chamber, wherein the one or more heater elements comprise one or more quasi-continuous, coaxial heater rings, and wherein at least one heater ring is closer to or further from the substrate than other heater rings;
   one or more power supplies operable to provide electric current to the one or more quasi-continuous heater elements;
   a translation assembly operably coupled to the heater assembly, wherein the translation assembly is operable to vary a distance between the heater assembly and the substrate;
   one or more temperature sensors operable to measure one or more substrate temperatures at one or more respective locations associated with the substrate; and
   a controller operably coupled to the heater assembly, the one or more temperature sensors, and the translation assembly, wherein the controller is operable to control the thermal radiation emitted by the one or more heater elements and the distance between the heater assembly and the substrate based, at least in part, on the substrate temperature measured at the one or more locations on the substrate.

2. The thermal processing system of claim 1, wherein the one or more heater rings are axisymmetric with respect to an axis normal to the substrate.

3. The thermal processing system of claim 1, wherein a total thermal radiation profile of the heater elements are radially-tunable, wherein the thermal radiation emitted by each of the one or more heater rings is individually controllable.

4. The thermal processing system of claim 1, wherein the one or more heater rings are coaxially in a common plane.

5. The thermal processing system of claim 1, wherein the one or more heater elements comprise an electric conductor or a semiconductor.

6. The thermal processing system of claim 1, wherein the heater chamber comprises a port for drawing a vacuum or delivering an inert or non-reactive gas therethrough.

7. The thermal processing system of claim 1, wherein the process chamber comprises a port for drawing a vacuum or a port delivering a process gas or inert gas therethrough.

8. The thermal processing system of claim 1, wherein the heater chamber further comprises a thermal shield, the thermal shield is operable to direct or reflect thermal energy toward the heater elements and the substrate.

9. The thermal processing system of claim 8, wherein the thermal shield is operably coupled to the heater assembly and is actively cooled or heated.

10. The thermal processing system of claim 1, wherein the translation assembly is operably coupled to the heater assembly, wherein the translation assembly is operable to linearly move the heater assembly along a direction perpendicular to the substrate inside the process chamber, thereby varying the distance between the heater assembly and the substrate according to the control signal from the controller.

11. The thermal processing system of claim 10, wherein the translation assembly is mechanically or magnetically coupled to the heater assembly.

12. The thermal processing system of claim 10, wherein the controller is operable to provide control data to the translation assembly, wherein the translation assembly is operable to vary the distance between the heater assembly and the substrate based on the control data.

13. The thermal processing system of claim 10, wherein the heater chamber further comprises at least one motion mechanism that linearly moves the heater assembly while maintaining a vacuum integrity of the heater chamber.

14. The thermal processing system of claim 13, wherein the heater chamber further comprises a bellows, elastomer seal or a magnetic transporter to maintain the vacuum integrity of the heater chamber.

15. The thermal processing system of claim 10, wherein the translation assembly further comprises a motion generation device comprising a servo motor, a piezoelectric drive, or a pneumatic pump.

16. The thermal processing system of claim 10, wherein the translation assembly further comprises a positional sensing system, wherein a linear position of the heater assembly is measured and fed back to the controller.

17. The thermal processing system of claim 1, wherein the power supply comprises a single power supply operable to provide electric power to a plurality of heater elements according to one or more control signals from the controller.

18. The thermal processing system of claim 1, wherein the one or more temperature sensors comprise one or more remote temperature sensors or one or more contact-type temperature sensors.

19. The thermal processing system of claim 18, wherein the process chamber comprises one or more optical paths for remote sensing of one or more substrate temperatures at the one or more locations using one or more remote temperature sensors.

20. The thermal processing system of claim 18, wherein the process chamber comprises one or more electrical paths for conducting electrical signals of one or more contact-type temperature sensors.

21. The thermal processing system of claim 1, wherein the heater chamber comprises a shutter located above the thermally-transparent plate, wherein the shutter is operable to close and to block thermal radiation from the heater assembly to the substrate when the heater assembly is retracted sufficiently from the substrate.

22. The thermal processing system of claim 1, wherein the controller further comprises a single-channel feedback control system.

23. The thermal processing system of claim 22, wherein the controller further comprises a multi-channel closed-loop feedback control system.

24. The thermal processing system of claim 1, further comprising a control computer, wherein the controller in conjunction with the control computer comprises electrical and electronic circuits, control programs and algorithms operable to control the thermal radiation emitted by the one or more heater elements, based on the measured one or more temperatures at the one or more locations, a desired substrate temperature versus time profile and a process gas composition versus time profile.

25. The thermal processing system of claim 1, where at least one of the heater rings is adapted to be selectably tilted with respect to a direction generally normal to the substrate.

26. The thermal processing system of claim 1, wherein the heater chamber further comprises an auxiliary heater ring, the auxiliary heater ring being coaxial with the substrate and having a diameter approximately equal to or greater than a diameter of the substrate.

27. The thermal processing system of claim 26, wherein the auxiliary heater ring is stationary with respect to the process chamber.

28. The thermal processing system of claim 26, wherein a thermal radiation of the auxiliary heater ring is operably controlled, at least partially, in response to a target temperature of the substrate, a measured substrate temperature, and a distance between the heater assembly and the substrate.

29. A thermal processing system, comprising:
a heater chamber;
a process chamber;
a generally thermally-transparent plate separating the heater chamber and the process chamber;
a heater assembly disposed within the heater chamber, the heater assembly comprising one or more quasi-continuous heater elements, wherein the one or more heater elements are operable to emit thermal radiation that transmits through the thermally-transparent plate toward a substrate disposed in the process chamber, wherein the one or more heater elements comprise one or more quasi-continuous, coaxial heater rings, where at least one of the heater rings is adapted to be selectably tilted with respect to a direction generally normal to the substrate;
one or more power supplies operable to provide electric current to the one or more quasi-continuous heater elements;
a translation assembly operably coupled to the heater assembly, wherein the translation assembly is operable to vary a distance between the heater assembly and the substrate;
one or more temperature sensors operable to measure one or more substrate temperatures at one or more respective locations associated with the substrate; and
a controller operably coupled to the heater assembly, the one or more temperature sensors, and the translation assembly, wherein the controller is operable to control the thermal radiation emitted by the one or more heater elements and the distance between the heater assembly and the substrate based, at least in part, on the substrate temperature measured at the one or more locations on the substrate.

30. A thermal processing system, comprising:
a heater chamber;
a process chamber;
a generally thermally-transparent plate separating the heater chamber and the process chamber;
a heater assembly disposed within the heater chamber, the heater assembly comprising one or more quasi-continuous heater elements, wherein the one or more heater elements are operable to emit thermal radiation that transmits through the thermally-transparent plate toward a substrate disposed in the process chamber;
an auxiliary heater ring, wherein the auxiliary heater ring is coaxial with the substrate and has a diameter approximately equal to or greater than a diameter of the substrate;
one or more power supplies operable to provide electric current to the one or more quasi-continuous heater elements;
a translation assembly operably coupled to the heater assembly, wherein the translation assembly is operable to vary a distance between the heater assembly and the substrate;
one or more temperature sensors operable to measure one or more substrate temperatures at one or more respective locations associated with the substrate; and
a controller operably coupled to the heater assembly, the one or more temperature sensors, and the translation assembly, wherein the controller is operable to control the thermal radiation emitted by the one or more heater elements and the distance between the heater assembly and the substrate based, at least in part, on the substrate temperature measured at the one or more locations on the substrate.

31. The thermal processing system of claim 30, wherein the auxiliary heater ring is stationary with respect to the process chamber.

32. The thermal processing system of claim 30, wherein a thermal radiation of the auxiliary heater ring is operably controlled, at least partially, in response to a target temperature of the substrate, a measured substrate temperature, and a distance between the heater assembly and the substrate.

33. A method of thermally processing a substrate, comprising:
establishing an initial thermal radiation profile of a heater assembly by applying an initial set of electrical powers to one or more quasi-continuous heater rings of said heater assembly in a heater chamber, wherein each of the one or more heater rings is individually movable with respect to the substrate in the process chamber;
loading said substrate into a process chamber and establishing an initial gas ambient or vacuum;
opening a shutter in said heater chamber and moving said heater assembly towards said substrate so that thermal radiation from said heater assembly transmits through a thermally-transparent plate onto said substrate in said process chamber;
measuring a distance between said substrate and said heater assembly, and adjusting said distance, said electrical powers for said heater rings or said gas ambient based upon a desired temperature versus time profile, a desired temperature uniformity of said substrate, a desired process gas composition versus time profile, the measured distance and measured temperatures; and
moving said heater assembly to home position, closing said shutter and unloading said substrate from said process chamber.

34. The method of claim 33, further comprising repeating the measurement of the distance and the temperatures, and adjusting the distance and electrical powers throughout a thermal processing period of the substrate.

35. The method of claim 33, wherein the measuring and adjusting occurs concurrently with the establishment of the gas ambient in the process chamber, wherein a process gas is employed in a thermal processing of the substrate.

36. The method of claim 33, wherein determining the adjustment to said electrical powers comprises using multi-channel temperature input and multi-channel electrical power output, or single-channel temperature input and multi-channel electrical power output closed-loop feedback control.

37. The method of claim 33, wherein determining the adjustment to said distance comprises comparison of one or more desired temperatures and temperature profiles with the one or more measured temperature and temperature profiles of said substrate at different locations.

38. The method of claim 33, where at least one of said distance, said electrical powers to said heater rings and said gas ambient in said process chamber is controlled in real-time according to pre-determined profiles or conditions for thermal processing.

39. The method of claim 33, wherein determining the adjustment to said distance and said electric powers or said gas ambient comprises utilizing mathematical algorithms, physical models, chemical models, or automatic data acquisition and process control via a computer.

40. The method of claim 33, further comprising moving the heater assembly between a home position and a maximal heating position to said substrate, wherein the former is further than the latter from said substrate.

41. The method of claim 33, wherein the adjustment of the distance comprises linearly moving the heater assembly, and wherein the linear motion of said heater assembly is used to control a heating level of said substrate in said process chamber.

42. The method of claim 33, wherein said electrical powers applied to said heater rings of said heater assembly are adjusted or tuned independently to control the radial profile of the thermal radiation of said heater assembly for desired temperature uniformity across said substrate.

43. The method of claim 33, wherein said distance versus time profile and said electrical powers versus time profiles applied to said heater rings are determined by a prior optimization procedure performed on one or more test substrates.

44. The method of claim 33, further comprising forming a vacuum in the process chamber one or more times, before, during or after a thermal processing cycle.

45. The method of claim 33, wherein measuring the one or more temperatures at the one or more locations associated with the substrate comprises utilizing one or more non-contact or remote temperature sensors, or one or more contact-type temperature sensors deployed onto or about the substrate.

46. The method of claim 33, wherein measuring the one or more temperatures at the one or more locations associated with the substrate comprises using a multi-channel pyrometer.

47. The method of claim 33, the adjustment of said thermal radiation profile of said heater assembly includes the operation of tilting one or more heating rings in one or more respective directions as conventionally defined by polar and azimuthal angles.

48. The thermal processing system of claim 1, further comprising
    two or more heater assemblies, wherein the substrate under processing is sandwiched between the two or more heater assemblies.

49. The system of claim 48, wherein a thermal radiation profile of at least one of the two or more heater assemblies is radially-tunable or linearly-moving.

50. A method of thermally processing a substrate, comprising:
    establishing an initial thermal radiation profile of a heater assembly by applying an initial set of electrical powers to one or more quasi-continuous heater elements of said heater assembly in a heater chamber;
    loading said substrate into a process chamber and establishing an initial gas ambient or vacuum;
    opening a shutter in said heater chamber and moving said heater assembly towards said substrate so that thermal radiation from said heater assembly transmits through a thermally-transparent plate onto said substrate in said process chamber;
    measuring a distance between said substrate and said heater assembly, and measuring one or more temperatures at one or more locations of said substrate;
    adjusting said distance, said electrical powers for said heater elements or said gas ambient based upon a desired temperature versus time profile, a desired temperature uniformity of said substrate, a desired process gas composition versus time profile, the measured distance and measured temperatures, wherein the adjustment results in an adjusted thermal radiation profile, and wherein the adjustment of said thermal radiation profile of said heater assembly includes the operation of tilting one or more heating rings in one or more respective directions as conventionally defined by polar and azimuthal angles; and
    moving said heater assembly to home position, closing said shutter and unloading said substrate from said process chamber.

51. A thermal processing system, comprising:
    a heater chamber;
    a process chamber;
    a generally thermally-transparent plate separating the heater chamber and the process chamber;
    a heater assembly disposed within the heating chamber, the heater assembly comprising one or more discrete and independently-movable heater elements, wherein the one or more heater elements are operable to emit thermal radiation that transmits through the thermally-transparent plate toward a substrate disposed in the process chamber;
    one or more power supplies operable to provide electric current to the one or more quasi-continuous heater elements;
    a translation assembly operably coupled to the heater assembly, wherein the translation assembly is operable to vary a distance between the discrete heater elements and the substrate;
    one or more temperature sensors operable to measure one or more substrate temperatures at one or more respective locations associated with the substrate; and
    a controller operably coupled to the heater assembly, the one or more temperature sensors, and the translation assembly, wherein the controller is operable to control the thermal radiation emitted by the one or more heater elements and the distance between the heater elements and the substrate based, at least in part, on the one or more substrate temperatures measured at the one or more locations on the substrate.

* * * * *